United States Patent
Nara (10) Patent No.: US 7,759,925 B2
(45) Date of Patent: Jul. 20, 2010

(54) SIGNAL ANALYZER AND METHOD FOR SIGNAL ANALYSIS

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/781,061

(22) Filed: Jul. 20, 2007

(65) Prior Publication Data
US 2008/0143316 A1 Jun. 19, 2008

(30) Foreign Application Priority Data
Jul. 21, 2006 (JP) ............... 2006-200101

(51) Int. Cl.
*G01R 23/00* (2006.01)
*G01R 13/00* (2006.01)

(52) U.S. Cl. ............. 324/76.19; 702/71

(58) Field of Classification Search ......... 324/76.19, 324/76.12, 76.11; 702/1, 57, 66, 67, 68, 702/71, 127, 189
See application file for complete search history.

(56) References Cited

U.S. PATENT DOCUMENTS

| | | | | |
|---|---|---|---|---|
| 4,081,607 A | * | 3/1978 | Vitols et al. | 704/237 |
| 4,481,665 A | * | 11/1984 | Ota | 382/102 |
| 4,823,283 A | * | 4/1989 | Diehm et al. | 715/825 |
| 5,519,820 A | * | 5/1996 | Kawauchi et al. | 345/440 |
| 5,866,907 A | * | 2/1999 | Drukier et al. | 250/366 |
| 6,584,419 B1 | | 6/2003 | Alexander | |
| 6,856,127 B1 | * | 2/2005 | Ramesh et al. | 324/102 |
| 7,159,187 B2 | * | 1/2007 | Bernard et al. | 715/771 |
| 2003/0085925 A1 | | 5/2003 | Bernard | |
| 2003/0198304 A1 | | 10/2003 | Sugar | |
| 2005/0207512 A1 | | 9/2005 | Earls | |
| 2006/0052946 A1 | * | 3/2006 | Yukawa et al. | 702/20 |
| 2007/0280366 A1 | * | 12/2007 | Aytur et al. | 375/260 |

FOREIGN PATENT DOCUMENTS

JP 11337588 A * 12/1999

OTHER PUBLICATIONS

Marcus Da Silva, Trigger-Capture-Analyse: Three Steps Toward Understanding Today's Complex RF Signals, Microwave Journal, Mar. 2004, pp. 22, 24, 26, 28, 30, 32, 34 & 36, vol. 47, No. 2, Horizon House Publications, Norwood, MA USA.

* cited by examiner

*Primary Examiner*—Hoai-An D Nguyen
(74) *Attorney, Agent, or Firm*—Matthew D. Rabdau (57) ABSTRACT

A signal analyzer repetitively memorizes waveform data of a signal under test to detect peaks P1-P6 of the waveform data. Waveform widths of the waveform data at a mask reference level, or a predetermined level down from the respective peaks, are evaluated as mask reference widths and then masks of the respective peaks are set using the mask reference level and mask reference widths. Hence the masks are automatically set, so a user can easily obtain time domain data and/or frequency domain data including characterizing portions in the signal under test.

8 Claims, 7 Drawing Sheets

SIGNAL ANALYZER AND METHOD FOR SIGNAL ANALYSIS

BACKGROUND

Embodiments of the present invention relate to mask settings for a signal analyzer, especially to a signal analyzer featuring automatic mask settings and methods for realizing these functions.

A system such as a wireless communication system for a mobile phone requires tests for confirming whether the used signals have no error. A signal analyzer may be used for measuring such a signal under test (SUT). The signal analyzer converts the SUT to digital data of time domain and then produces spectrum data that is digital data of frequency domain. The spectrum data may be obtain using a fast Fourier transform (FFT) or similar calculation. The obtained data is displayed as waveforms or numerical values on a display screen of the signal analyzer. The signal analyzer can provide not only the spectrum data of the SUT but also the time domain data corresponding to the spectrum data so that it can provide various signal analysis through digital calculation from two viewpoints of frequency domain and time domain. U.S. Pat. No. 6,377,617 discloses a technology that produces frequency and time domain data while correlating them each other, for example.

Figure 1:
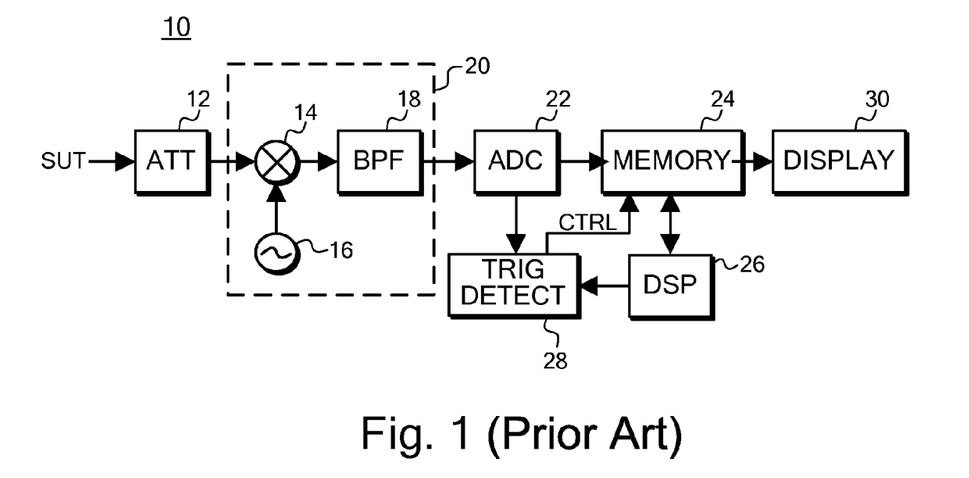
FIG. 1 (Prior Art) is a functional block diagram of an example of a signal analyzer.

FIG. 1 (Prior Art) is a block diagram of a signal analyzer 10. The signal analyzer 10 has, in addition to the blocks shown in FIG. 1, functions and hardware equivalent to a PC though they are not shown. It adopts a general-purpose CPU typical of a PC, provides various settings through graphical user interface with keyboard and mouse, and can store large amount of data and program in a hard disk drive (HDD).

An input attenuator 12 adjusts the SUT to a proper level and provides it to an analog down converter 20. The down converter 20 has mixer 14, local oscillator 16 and band pass filter 18 and down converts frequencies of an input signal to produce an intermediate frequency (IF) signal with an analog process. An analog to digital converter (ADC) 22 converts the analog IF signal to digital data (time domain data). A memory 24 stores the digital data of the IF signal. A digital signal processor (DSP) 26 reads out the IF signal data from the memory 24 and conducts digital down conversion and fast Fourier transform (FFT) to produce spectrum data of frequency domain data. The spectrum data is stored in the memory 24 and then displayed as waveforms or numerical values by a display 30. The DSP 26 may be used for other various calculations according to program stored in the HDD. A trigger detection circuit 28 receives the time domain data from the ADC 22 and the spectrum data from the DSP 26 to identify data that satisfies a user set trigger condition and controls the memory 24 to keep the user desired time domain data and/or spectrum data in the memory 24.

The memory 24 may be a RAM that can provide faster data reading and writing than the HDD so that it is suitable for temporarily keeping the time domain data and/or the spectrum data that are produced fast. An HDD has a large capacity but the data reading/writing is slow so that it is difficult to continuously record the fast time domain data and/or spectrum data. Therefore, a trigger condition is provided, the data satisfying the trigger condition is temporarily stored in the memory 24 and then only necessary data is stored in the HDD.

Various trigger condition settings controlled with the trigger detection circuit 28 are known. The trigger condition settings using time domain data are similar to those of a digital oscilloscope. In a conventional trigger setting, a given threshold is set, time domain data of the SUT around a trigger point, or an SUT portion that is over the threshold, is being stored into a memory as far as the memory capacity accepts to display it as a waveform. In addition to the traditional trigger condition setting, another trigger condition setting is widely used that a mask is set to be compared with a displayed waveform to determine whether the waveform enters the mask. As for proper mask settings, U.S. Pat. No. 6,728,648 (corresponding to Japanese patent 3,670,944) discloses that it displays a waveform based on the conventional trigger condition, and then automatically adjusts test mask position as a normal waveform not to touch the mask.

A trigger condition setting using a mask for spectrum data is also known. For example, U.S. Patent Publication 2003/0085925 (corresponding to Japanese patent publication 2003-194855) discloses that spectrum data is displayed as a waveform and a mask for the waveform is set and edited.

Generally it is difficult to capture an intermittent phenomenon that occurs less frequently. But if a signal under test (SUT) is measured with a signal analyzer and if it is roughly predicted when and around which frequency the intermittent phenomenon occurs, the intermittent phenomena may be captured effectively as frequency domain data by setting frequency mask trigger based on the prediction before acquiring the SUT data. Conversely, if it can not be predicted the capture efficiency dramatically drops.

In case that it is difficult to predict how to set a mask or even a case that it can be predicted, if a user can set a trigger condition using a mask easily desired portions such as defect in the SUT can be easily captured in a memory of a signal analyzer.

Therefore, what is desired is to make a signal analyzer automatically set a mask to easily capture desired time domain data or frequency domain data in an SUT.

SUMMARY

Embodiments of the present invention relate to a signal analyzer that derives time domain data and/or frequency domain data from a signal under test to process it as waveform data to analyze the signal under test. It features a function of repetitively storing waveform data concerning the signal under test, a function of detecting peaks of the waveform data, a function of detecting mask reference widths by evaluating waveform widths of the waveform data at a mask reference level down from the respective peaks by a predetermined level, and a function of setting masks at the respective peaks using the mask reference level and mask reference widths. This allows the signal analyzer to automatically set masks according to characteristics of the signal under test so that a user can easily obtain time domain data and/or frequency domain data including characterizing portions in the signal under test.

The signal analyzer according to an embodiment of the present invention may further feature a function of setting a peak frequency condition and a function of setting only masks corresponding to peaks satisfying the peak frequency condition. If the peak frequency condition is set to a low frequency, it can effectively collect only data of rarely occurred peak portions in the signal under test.

Another embodiment of the present invention is method to make a signal analyzer execute functions described below. The functions are specifically a function of repetitively storing waveform data concerning the signal under test, a function of detecting peaks of the waveform data, a function of detecting mask reference widths by evaluating waveform widths of the waveform data at a mask reference level down from the respective peaks by a predetermined level, and a function of setting masks at the respective peaks using the mask reference level and mask reference widths. In addition to them, embodiments of the present invention may further make it execute a function of setting a peak frequency condition and a function of setting only masks corresponding to peaks satisfying the peak frequency condition.

In the mask setting function, the masks can be directly set with mask reference level and mask reference widths. The masks may, however, be set with a level having an offset relative to the mask reference level and widths having a given adjustment (e.g. −10%) relative to the mask reference widths.

In an embodiment of the present invention, a signal analyzer has memory to repetitively store waveform data concerning the signal under test. A peak detector detects the peaks of the waveform data. A mask width evaluator determines the reference widths by evaluating waveform widths of the waveform data at a mask reference level down from the respective peaks by a predetermined level; and a mask generator sets masks at the respective peaks using the mask reference level and mask reference widths. The peak detector, the mask width evaluator and the mask generator may be implemented in hardware such as an ASIC, or an FPGA. Alternatively, these functions may be implemented using software and a general purpose processor such as a PC.

DETAILED DESCRIPTION

Embodiments of the present invention use the same basic hardware as a conventional signal analyzer as shown in FIG. 1 (Prior Art). A current typical signal analyzer adopts hardware similar to a PC to control the whole system and is able to run the same operating system as a PC. Therefore, the program realizing embodiments of the present invention may be developed with a PC and then installed into the signal analyzer.

Figure 2:
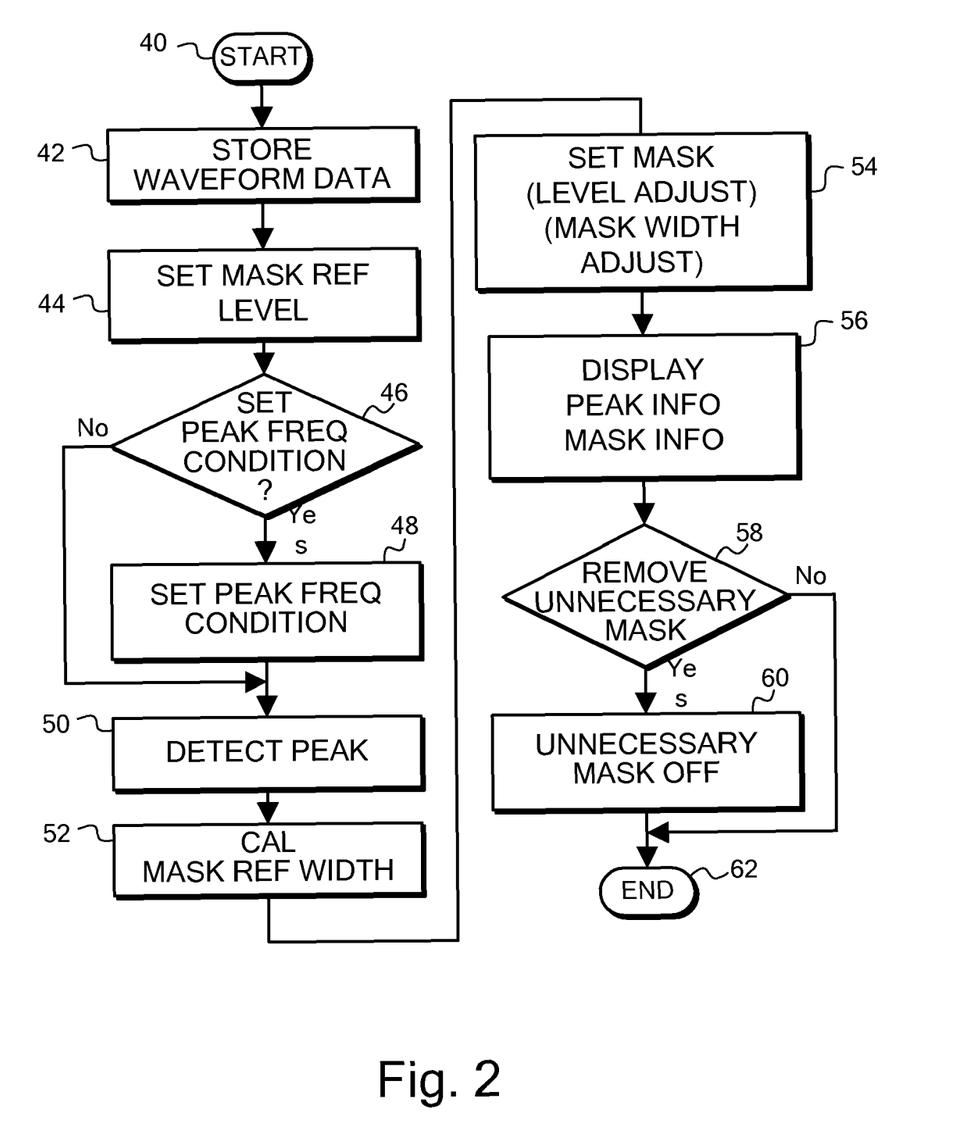
FIG. 2 is a flowchart of functional process steps according to an embodiment of the present invention.
Figure 3:
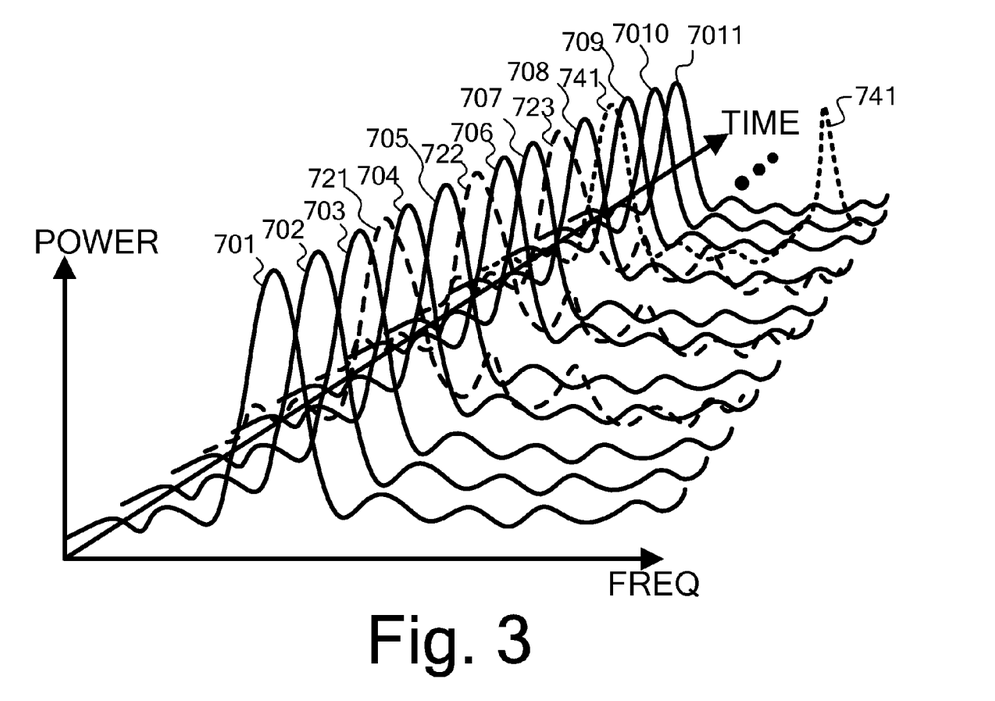
FIG. 3 illustrates an example of displaying frequency domain data (spectrum data) as waveforms with a depth direction as a time axis.

FIG. 2 is a flowchart showing process steps according to an embodiment the present invention. In step 42, waveform data is repetitively stored. FIG. 3 is an example displaying frequency domain data (spectrum data) as waveform data with a depth direction as a time axis. Waveforms indicated by 701-711 are the most frequent, waveforms of 721-723 are frequent at the next level and a waveform 741 is less frequent as it appears only one time here.

Figure 4:
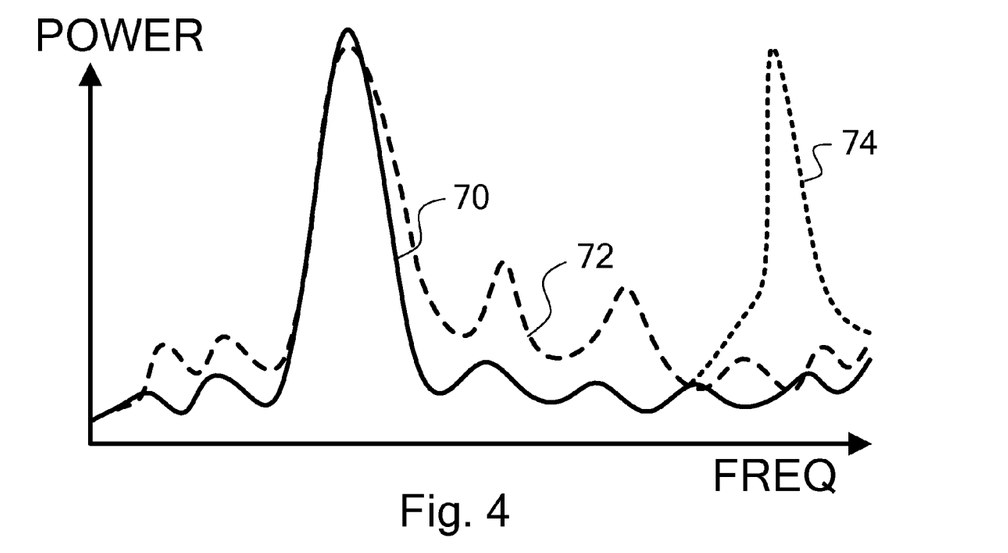
FIG. 4 illustrates an example of displaying waveform data of FIG. 3 as a waveform showing frequency information with intensity or color information.

FIG. 4 is an example displaying waveforms with frequency information of the waveform data with intensity (or color) information. A waveform 70 corresponds to the waveforms 701-711 in FIG. 3. Waveforms 72 and 74 respectively correspond to the waveforms 721-723 and the waveform 741 in FIG. 3. They are displayed on the display screen of the display 30. The frequency domain data is created every interval (frame) and repetitively stored into the memory 24. U.S. patent publication 2005/0057253 (corresponding to Japanese patent publication No. 2005-77413) discloses a technology to produce bitmap data of converting frequency information of the waveform data into intensity or color information. The bitmap data may be created while the waveform data of a plurality of frames are stored and be used for detecting peaks of the waveforms of the frames as described below.

FIGS. 3 and 4 are for describing how to store the waveform data of frequency domain data but the time domain data is also repetitively stored as waveform data similarly wherein there is no concept of "frame" but it is well known to capture repetitive waveforms with a given trigger condition (first trigger condition hereinafter). Then, the waveform data (time domain data) are repetitively stored based on the trigger reference points of SUT that satisfies the first trigger condition. In the following, examples of the frequency domain data are mainly described and if there are differences in case of the time domain data they are described each time.

Figure 5:
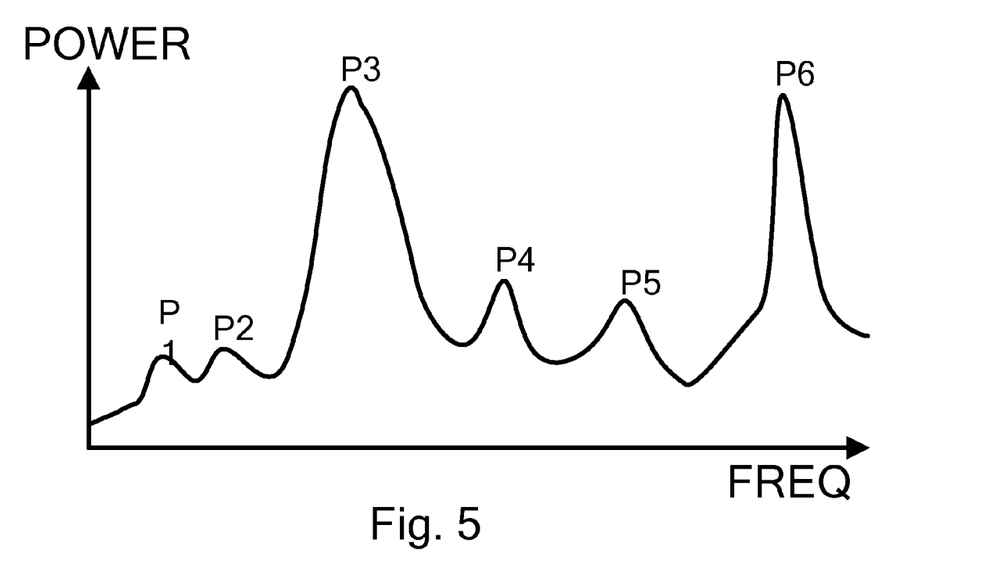
FIG. 5 illustrates an envelop waveform of maximum values of waveform data obtain in FIG. 4.

FIG. 5 shows an envelop waveform of the maximum values of the waveform data in FIG. 4 and there are six peaks P1-P6, for example. In an embodiment of the present invention, a mask reference level is set, as provided at step 44 of FIG. 2, and applied to each peak of the maximum value envelop waveform. The mask reference level may be −10 dB, for example, and the value can be set by the user each time or may be a default value previously stored in the signal analyzer. Alternatively, the mask reference level may be set at a lower level for example, as −10% or −5%. If the waveform data is time domain data it may be like −0.8 volt, for example. Usually the same mask reference level is applied to all of the peaks but different levels can be applied to the respective peaks.

Figure 6:
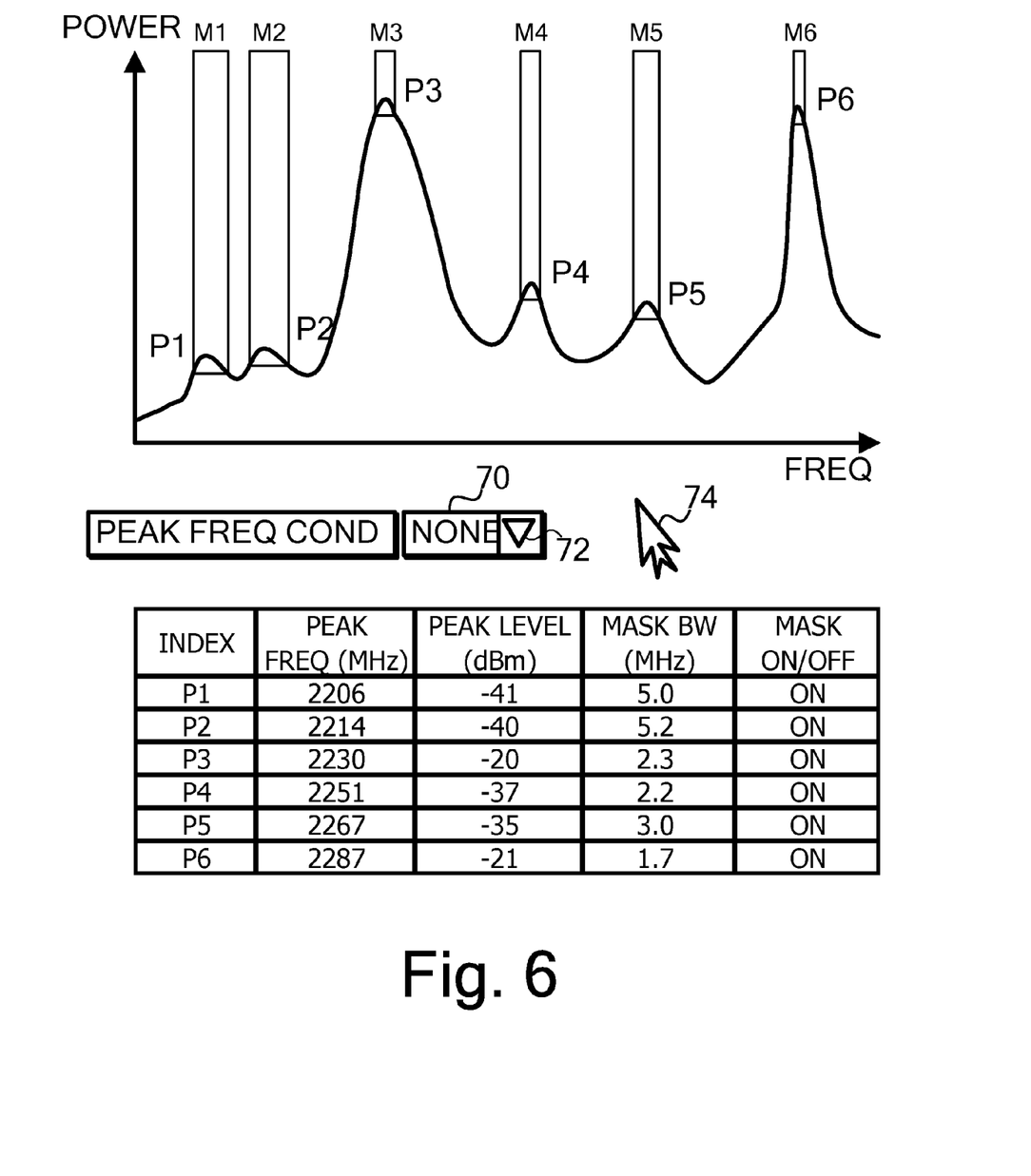
FIG. 6 illustrates an example of displaying a waveform with masks set according to an embodiment of the present invention.
Figure 7:
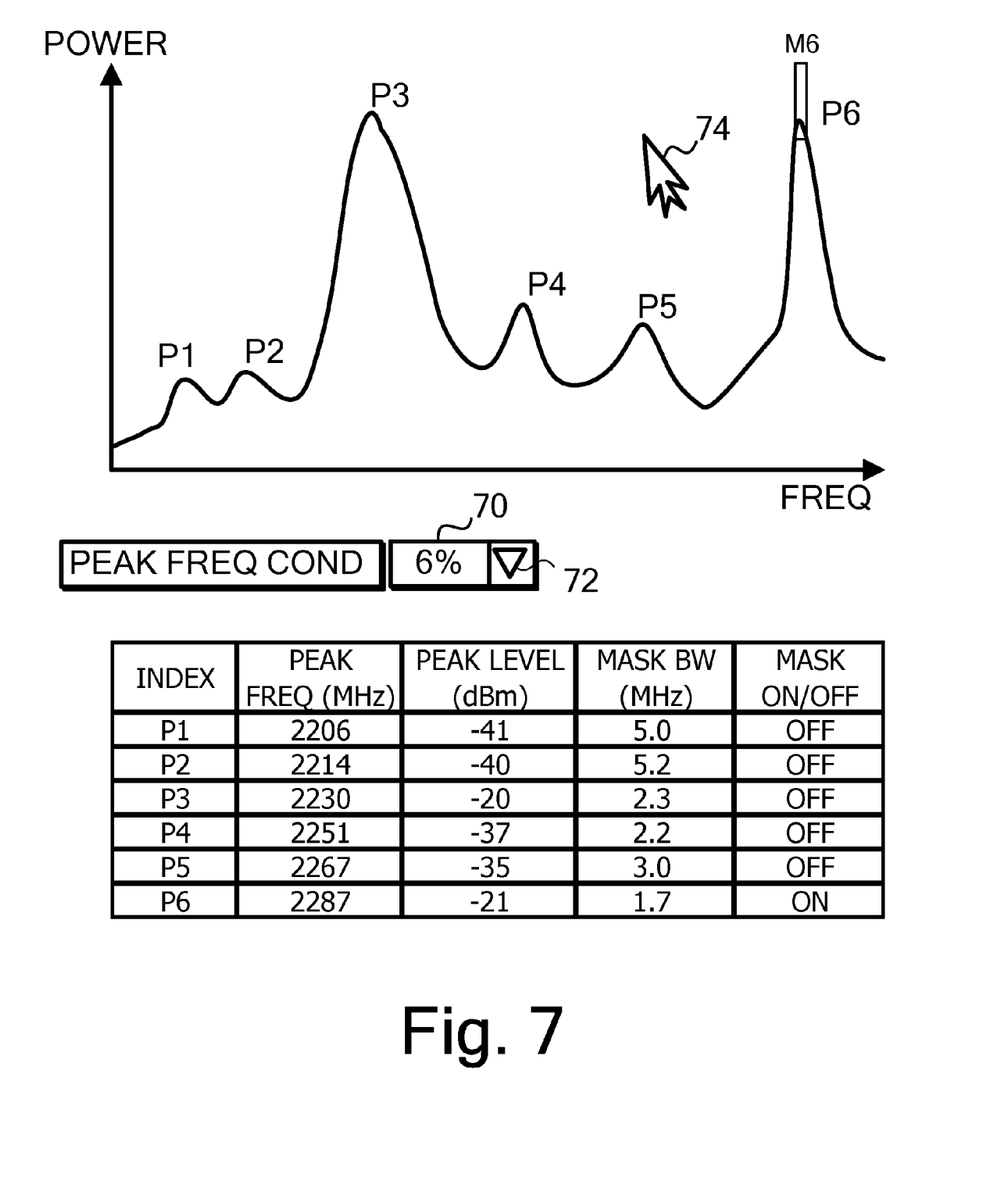
FIG. 7 illustrates another example of displaying a waveform with masks set according to another embodiment of the present invention.

Then, the user can set a peak frequency condition to the signal analyzer, as provided at steps 46 and 48 of FIG. 2, if necessary. The peak frequency condition setting is done through operations with a menu on the screen of the display 30 and the mouse. FIG. 6 shows a case that there is not the peak frequency condition. FIG. 7 shows a case that it is set to 6%. The peak frequency condition menu 70 may be a pull-down which allows setting a value of the peak frequency condition by selecting one from numerical values that appear by clicking a down-pointing triangle 72 with a mouse cursor 74.

The signal analyzer detects frequencies having peaks and the levels with a well known method, corresponding to step 50 of FIG. 2, wherein if the waveform data is time domain data, time distances from the trigger reference points are detected in place of the frequencies. The signal analyzer calculates waveform widths, as provided by step 52 of FIG. 2, at the level down from the peak levels as mask reference widths concerning the peaks satisfying the peak frequency condition and sets masks using them at step 54 of FIG. 2. In case of FIG. 6, masks are set to all of the peaks P1-P6 since there is no peak frequency condition setting. In FIG. 7, only a mask M6 is set to the peak P6 because it satisfies the peak frequency condition of 6%.

Figure 8:
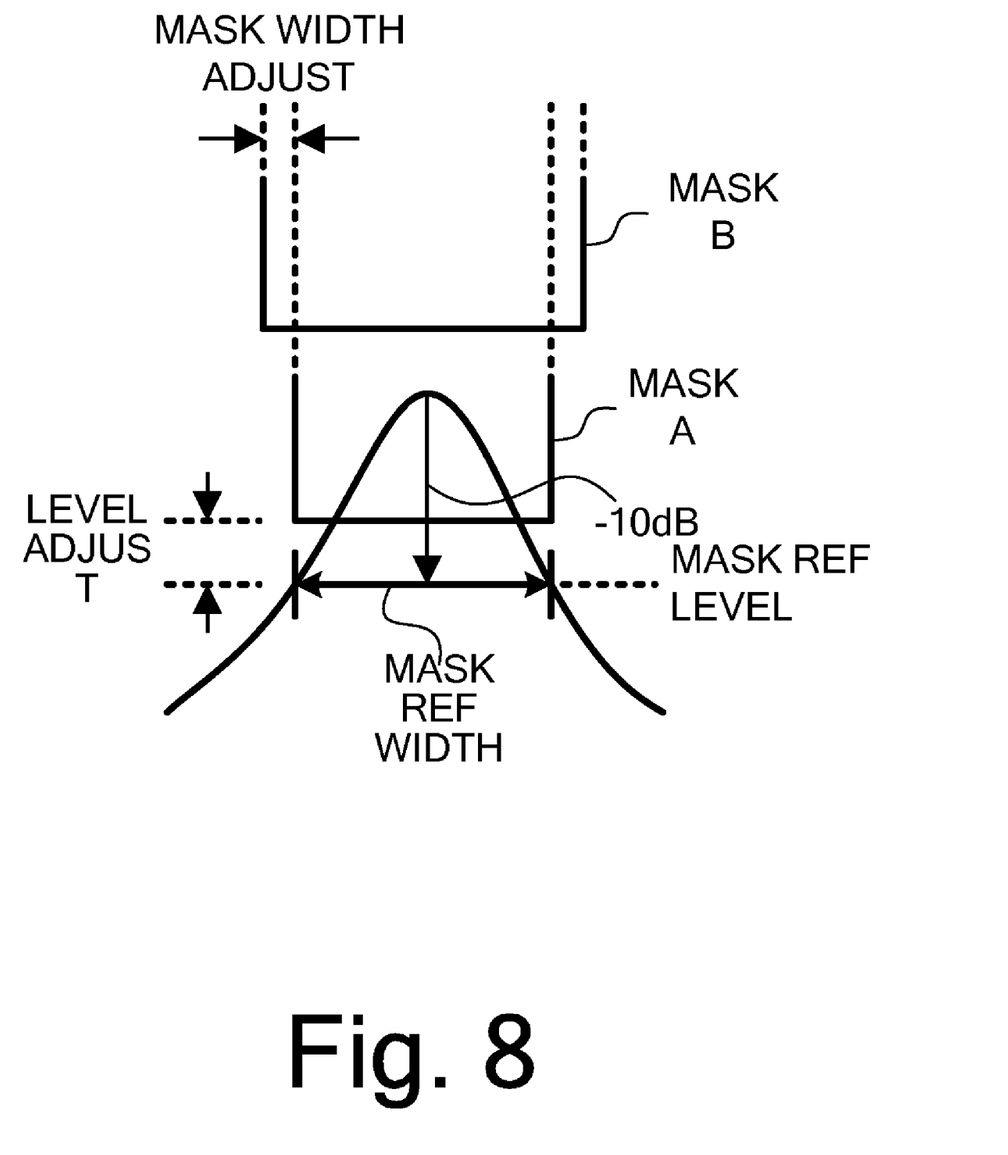
FIG. 8 illustrate an example of setting masks with adjusting a mask reference width and a mask reference level.

The masks can be directly set with the mask reference level and mask reference widths as shown in FIGS. 6 and 7. The masks may, however, be set with a level having an offset relative to the mask reference level and widths having a given adjustment (e.g. +10%) relative to the mask reference widths. A mask A of FIG. 8 is an example that has the same mask width as the mask reference width but has the bottom level adjusted relative to the mask reference level. A mask B is an example that the mask width and bottom level are both adjusted. These adjustment values may be set to the signal analyzer by the user or the signal analyzer may reuse previous setting values.

The peak information (peak frequencies and levels) and mask information (frequency widths and on/off of masks) may be displayed as a table as shown in FIGS. 6 and 7 (step 56). The user can take the mask settings off if they are not necessary by using the table as provided at steps 58 and 60 shown in FIG. 2. This process may be done by specifying unnecessary masks with the mouse cursor 74 and pressing a predetermined key (e.g. Delete key) on the keyboard. Another way may be to click an ON/OFF field of the mask corresponding to the desired peak on the table to toggle on and off.

The following is an example of the mask settings and SUT measurement with the set masks according to an embodiment of the present invention. First, an SUT is received for a time (e.g. one hour) suitable for setting masks and then the masks are automatically set. If a user wants to capture a phenomenon that may occur once, or so, per one hour, a proper setting of a peak frequency condition would be necessary. Alternatively, when one hour has passed and the masks are set, all of masks set for peaks of normal signals are taken off to leave only masks assumed to be set by abnormal peaks.

After the mask settings have completed, if the SUT is further received and waveform data of the SUT enters one of the masks a trigger condition is satisfied and the waveform data around at that time is maintained in the memory 24 and transferred to the HDD if necessary. Therefore, the waveform data entering the mask can be read even later. If the masks are set in the frequency domain the waveform data is frequency domain data but time domain data corresponding to the frequency domain data may be kept at the same time to be able to read it out later, which can be realized by using the technology disclosed in U.S. Pat. No. 6,377,617 described above.

Although it is difficult for a user to set a signal analyzer masks to capture a signal portion including an unknown intermittent peak in a signal under test, a signal analyzer according to embodiments of the present invention can automatically set masks to capture such an intermittent peak appropriately by itself as described above. Then if a signal including a similar intermittent peak is subsequently received, the signal analyzer can appropriately capture the relevant data portion to keep it in a memory and the data can be read out as necessary. Therefore, embodiments of the present invention are very effective for analyzing an abnormal phenomenon that occurs very rarely in a signal under test.

What is claimed is:

1. A signal analyzer comprising:
   a memory to repetitively store waveform data concerning a signal under test;
   a peak detector to detect the peaks of the waveform data;
   means for determining the reference widths by evaluating waveform widths of the waveform data at a mask reference level down from the respective peaks by a predetermined level; and
   means for setting masks at the respective peaks using the mask reference level and mask reference widths, wherein the setting means adjusts the mask widths relative to the mask reference width and adjusts the mask level relative to the mask reference level.

2. The signal analyzer as recited in claim 1, further comprising a peak frequency condition control to enable a peak frequency condition to be set, wherein the setting means only sets masks corresponding to peaks satisfying the peak frequency condition.

3. The signal analyzer as recited in claim 1, further comprising a mask selection interface, wherein a mask of the set masks is selectively turned off.

4. The signal analyzer as recited in claim 2, further comprising a mask selection interface, wherein a mask of the set masks is selectively turned off.

5. A method for creating trigger masks for a signal analyzer comprising:
   storing waveform data concerning a signal under test repetitively;
   detecting peaks of the waveform data;
   detecting mask reference widths by evaluating waveform widths of the waveform data at a mask reference level down from the respective peaks by a predetermined level; and
   setting masks at the respective peaks using the mask reference level and mask reference widths, wherein the step of setting masks further includes a step of adjusting the mask widths relative to the mask reference width and adjusting the mask level relative to the mask reference level.

6. The method as recited in claim 5, further comprising:
   setting a peak frequency condition; and
   setting only masks corresponding to peaks satisfying the peak frequency condition.

7. A computer readable storage medium, tangibly embodying a computer program to provide instructions executable by a computer to perform the method steps of:
   storing waveform data concerning a signal under test repetitively;
   detecting peaks of the waveform data;
   detecting mask reference widths by evaluating waveform widths of the waveform data at a mask reference level down from the respective peaks by a predetermined level; and
   setting masks at the respective peaks using the mask reference level and mask reference widths, wherein the step of setting masks further includes a step of adjusting the mask widths relative to the mask reference width and adjusting the mask level relative to the mask reference level.

8. The computer readable storage medium, as recited in claim 7, further comprising instruction executable by a computer to perform the further steps of:
   setting a peak frequency condition; and
   setting only masks corresponding to peaks satisfying the peak frequency condition.

* * * * *